Oct. 30, 1962 A. S. WESTNEAT, JR 3,061,802
FREQUENCY MODULATED CRYSTAL OSCILLATOR
Filed May 14, 1954 2 Sheets-Sheet 1

ARTHUR S. WESTNEAT, JR.
*INVENTOR.*

BY Ralph K. Bonell

*AGENT*

ARTHUR S. WESTNEAT, JR.
*INVENTOR.*

*BY* Ralph K. Bonell

*AGENT*

3,061,802

FREQUENCY MODULATED CRYSTAL OSCILLATOR

Arthur S. Westneat, Jr., Princeton, N.J., assignor, by mesne assignments, to Electro-Mechanical Research, Inc., Sarasota, Fla., a corporation of Connecticut Filed May 14, 1954, Ser. No. 429,730
4 Claims. (Cl. 332—26)

This invention relates to electric oscillators. More particularly it refers to an oscillator whose frequency of oscillation is stabilized by a sharply resonant circuit element, but which is susceptible of frequency modulation over a useful working range, and to the means for accomplishing such modulation.

When a high-frequency oscillator is intended to operate at a constant frequency, a common method of attaining frequency stability is through the use of a quartz crystal or similar sharply resonant element. A suitably adjusted feed-back circuit comprising such a crystal in association with an amplifier meets the conditions for oscillation, and will oscillate at the resonant frequency of the crystal. The conditions for oscillation are that the total phase shift around the closed loop be zero, and that there be sufficient feed-back to overcome the losses of the circuit. If, however, instead of operating at a constant frequency, it is desired to vary the frequency of a crystal-stabilized oscillator in response to an input modulating signal, difficulties are encountered which it is one purpose of the present invention to overcome.

In applying the principles of the invention crystal-stabilized oscillators are provided whereby substantially linear frequency-modulation over a selected range, and in accordance with the magnitude of an applied signal, may be produced without unduly sacrificing stability about an unmodulated operating frequency. These arrangements include a parallel-tuned circuit effectively connected in series with the crystal. The impedance of the tuned circuit which is largely resistive near resonance damps the crystal vibrations to a controllable degree, and causes the phase shift and change of crystal circuit impedance, both resulting from the departure of the operating frequency from the resonant frequency of the crystal, to be less pronounced than in the case of an undamped crystal. The change of tuning of the parallel-tuned circuit, under the influence of a modulating signal, is then employed to introduce a phase shift in the feed-back loop which requires a change in the operating frequency of the oscillator in order to supply a compensating phase shift in the crystal circuit and to maintain the necessary phase condition for oscillation. The broadened response of the damped crystal circuit permits adequate transmission through this circuit at such off-resonant frequency to supply the feed-back necessary to sustain oscillation. By suitable adjustment of the damping, the modification of the transmission characteristics of the crystal, that is, modification of phase-shift and impedance with change of frequency, can be made just sufficient to allow frequency modulation over a desired range without unduly modifying the normal tendency of the circuit to oscillate at the crystal frequency when no modulating signal is applied. The stablizing effect of the crystal is thus retained to a satisfactory degree.

In connection with the circuit arrangements disclosed herein, reference is made to the application of W. van B. Roberts for "Frequency Modulated Crystal Oscillator," Serial No. 429,720, now abandoned, filed concurrently herewith, which discloses other means for effecting frequency modulation of a crystal-controlled oscillator.

It is an object of the invention to provide circuit means for effecting frequency-modulation of an oscillator, stabilized by a piezo-electric crystal or like sharply resonant member, without unduly sacrificing stability about an unmodulated operating frequency.

It is another object to provide in an oscillator circuit of the above character tuned circuit means serving both to modify the transmission characteristic of said resonant element and to effect frequency-modulation responsive to an applied modulation signal.

It is a further object to provide means for modulating the frequency of a crystal-stablized oscillator whereby a substantially linear relationship is maintained between oscillator frequency and magnitude of the modulation signal.

Other objects and advantages of the invention will be apparent upon consideration of the following specification and of the appended drawings in which:

FIG. 1 is a circuit diagram showing one form of the oscillator of the invention;

FIGS. 2–4, incl., are circuit diagrams showing modifications of a part of the circuit of FIG. 1;

Figure 1:
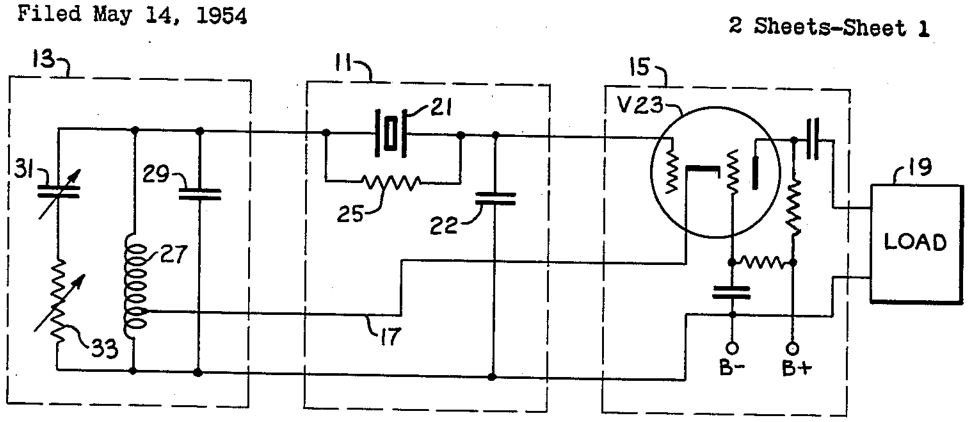

In the embodiment of the invention shown in the diagram of FIG. 1, crystal circuit 11, tuned circuit 13, and amplifier 15, together with cathode feed-back connection 17, constitute a closed-loop circuit capable of oscillating and supplying oscillatory energy to a load 19. Minor circuit components are omitted for simplicity of illustration.

Circuit 11 comprises quartz crystal 21 and shunt condenser 22, while amplifier circuit 15 comprises tetrode V23 of which the cathode and two grids constitute an amplifying triode, and of which the plate circuit is electron-coupled to the triode. Resistor 25 provides a D.C. path for the control grid bias of V23 and has a value high enough so that the damping of the crystal is not significantly affected thereby. Tuned circuit 13 comprises tapped reactor 27 and condenser 29 connected in parallel, this combination, in turn, being shunted by serially connected variable condenser 31 and variable resistor 33.

In its normal condition, that is, in the absence of a modulating signal, circuit 13 is adjusted to introduce zero phase shift at the resonant frequency of crystal 21 or, in actual practice, at the slightly higher resonant frequency of the combination of crystal 21 and condenser 22. The total phase shift around the loop is thus zero. In this condition the total lagging current and the total leading current drawn by the susceptances of the three parallel branches of circuit 13 are equal, and the resultant current is in phase with the voltage across the circuit. In the arrangement of FIG. 1, the leading current drawn by the branch comprising condenser 31 and resistor 33 may be varied, for purposes of frequency modulation, by varying the value of either of these members, or both. Such variation may be continuous in certain applications and discontinuous in others. Change of value of other of the components of circuit 13, not indicated as variable in the figure, also may be employed for varying the reactive current drawn by the circuit.

Figure 2:
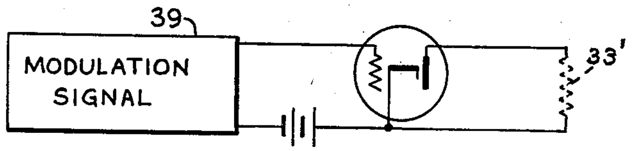

Assuming, first, that modulation is produced by a change of the resistance of resistor 33, an increase in resistance will decrease the leading current drawn by condenser 31 and thereby produce a phase shift through circuit 13 in one direction, while a decrease of resistance will increase said leading current and produce a phase shift in the opposite direction. In either case the compensating shift through the crystal circuit 11 necessary to maintain the phase condition for oscillation is brought about by a shift in the operating frequency of the oscillator. A modulating signal for varying the value of resistor 33 may be introduced and may operate in various ways. If resistor 33 has the form of a rheostat, the signal may be the mechanical rotation of a shaft or the resistor may take the form of a resistance determined by the variable plate circuit resistance 33' of a vacuum tube and the modulating signal 39 be applied as a grid voltage, as illustrated in FIG. 2.

Figure 3:
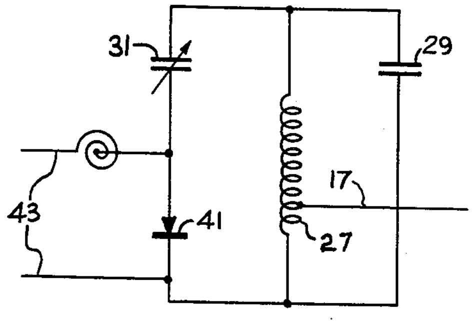

In FIG. 3 the variable resistance in series with condenser 31 takes the form of crystal diode 41 whose resistance value is varied by a D.C. signal applied to leads 43 to vary the diode bias and thereby the position of the operating point on the diode characteristic. In applications where only two operating frequencies are used, the diode is merely required to operate as a switch in series with condenser 31.

Figure 4:
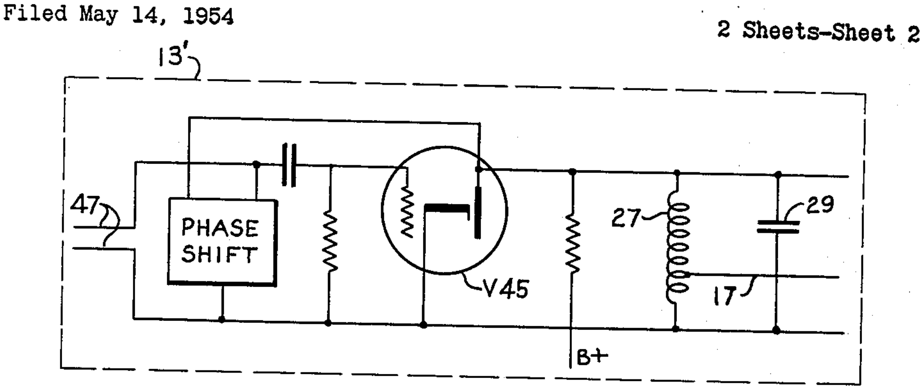

In FIG. 4 the entire combination of serially connected condenser 31 and resistor 33 of FIG. 1 is replaced by the output circuit of reactance tube V45 having input leads 47 to which a modulating signal may be applied for varying the reactive output current, the combination with reactor 27 and condenser 29 constituting a modification 13' of tuned circuit 13.

In addition to introducing a variable phase shift in the feed-back loop, circuit 13 supplies the major portion of the externally applied damping for crystal 21 since its impedance, largely resistive near resonance, is effectively in series with the crystal. As the "Q" factor of crystal 21 is generally extremely high, the equivalent series resistance of circuit 13 may become relatively high before the resonance characteristic of the crystal is appreciably affected, thus permitting the use of a fairly sharply tuned circuit without over-damping the crystal.

In operation, the feed-back voltage in the circuit of FIG. 1 may be assumed to be generated in circuit 13, normally tuned to the unmodulated operating frequency, and fed to the control grid of V23 through the impedance of circuit 11. At any frequency the voltage across circuit 13 will bear a phase relationship to the driving current that is a function of the "Q" of the circuit and the ratio of the operating frequency to the resonant frequency of the circuit. The voltage across condenser 22 that appears at the control grid of V23, in addition, depends both on the phase shift introduced by crystal 21 and on the magnitude of the crystal impedance, each again being a function of the operating frequency.

Figure 6:
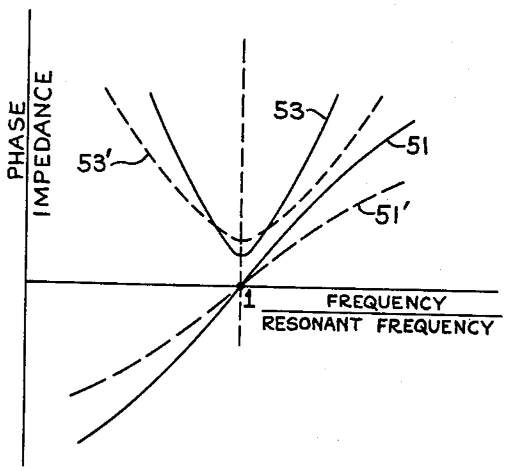
FIG. 6 shows, in graphical form, certain characteristics of the circuit of FIG. 5.
Figure 5:
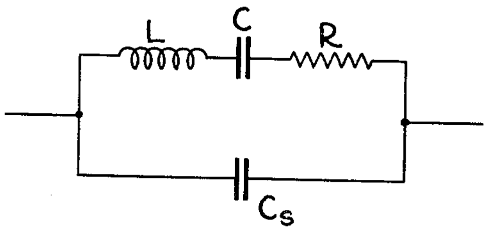
FIG. 5 shows an equivalent electrical circuit of a quartz crystal.

To illustrate the manner in which the values of the circuit parameters above referred to vary with change of operating frequency, FIG. 5 shows the equivalent electrical circuit of quartz crystal 21 and FIG. 6 shows typical variations of the phase and impedance of such a circuit as a function of the ratio of operating frequency to the resonant frequency of the crystal. In the latter figure solid curves 51 and 53 are the phase and impedance characteristics, respectively, when no external damping is employed, while dashed curves 51' and 53' are the corresponding characteristics when damping resistance is added, which in the circuit of FIG. 1 is the resistive component of the impedance of tuned circuit 13. The curves of FIG. 6 include only the series resonance condition of crystal 21.

Figure 7:
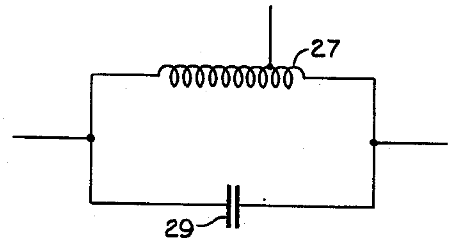
FIG. 7 shows a parallel-tuned circuit.
Figure 8:
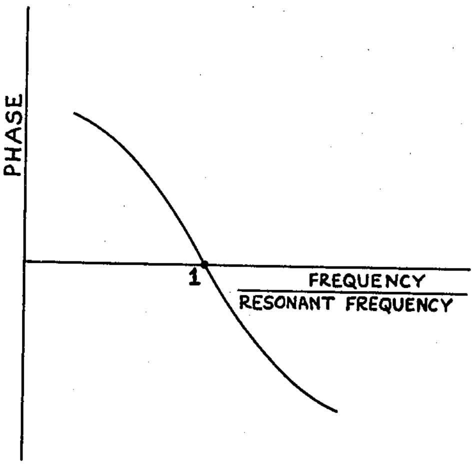
FIG. 8 shows, in graphical form, the phase characteristic of the circuit of FIG. 7 with change of frequency.

FIG. 7 shows the parallel combination of reactor 27 and condenser 29 of circuit 13, and FIG. 8 shows the phase relationship between the voltage across the combination and the driving current as a function of the ratio of operating frequency to the parallel resonant frequency of the circuit.

It will be apparent from consideration of the above-described figures that with circuit 13 initially tuned to the resonant frequency of circuit 11 (comprising crystal 21 and condenser 22), an input modulating signal, causes a change of tuning of circuit 13 (and hence a change of reactive current drawn thereby), and also changes the ratio of operating frequency to the resonant frequency. The operating frequency immediately changes to a new value at which the respective phase shifts through circuits 13 and 11 annul one another. By broadening the phase characteristic of the crystal about resonance through the damping introduced by the resistive component of the impedance of circuit 13, sufficient feed-back voltage of appropriate phase is caused to appear at the control grid of V23. This voltage is at the new off-resonant frequency to sustain oscillation at this frequency.

A very nearly linear frequency modulation, relative to the modulating signal, over a considerable working range can be attained by choice of a suitable type of resistance or other element of tuned circuit 13 for control by the modulating signal. For correcting residual non-linearity of the overall frequency modulation, a compensating non-linear characteristic may be adopted for this element.

The embodiments of the invention shown and described herein are by way of illustration, only, and not by way of limitation. The limits of the invention are defined solely in the appended claims.

I claim:

1. Means for generating oscillations modulated in frequency within a predetermined frequency range comprising an electron discharge device having at least a cathode, an anode and a control electrode, a parallel-tuned circuit tuned to a frequency in said range such that the phase shift provided by said circuit has a predetermined value and is variable in a first sense with changes in the frequency of said oscillations in a predetermined direction, said tuned circuit comprising a coil and a capacitor connected in parallel, a crystal tuned to series-resonance at a frequency within said range such that the phase shift provided by said crystal is opposite to the phase shift of said circuit and is variable in a second sense opposite to said first sense with changes in the frequency of said oscillations in said predetermined direction, means connecting one terminal of said crystal to said control electrode, means connecting the other terminal of said crystal to one end of said coil, means connecting the other end of said coil to said anode, means connecting said cathode to a point in said tuned circuit at a potential intermediate the potentials at said ends of said coil, said parallel-tuned circuit further comprising a variable impedance for varying the phase shift thereof, and modulating means connected to said variable impedance for modulating the value of said impedance and thereby modulating the frequency of said oscillations over said predetermined frequency range.

2. Means for generating oscillations modulated in frequency within a predetermined frequency range comprising an electron discharge device having at least a cathode, an anode and a control electrode, a parallel-tuned circuit having a plurality of parallel-connected branches and tuned to a frequency in said range such that the phase shift provided by said circuit has a predetermined value and is variable in a first sense with changes in the frequency of said oscillations in a predetermined direction, one of said branches comprising a coil, another of said branches comprising a capacitor and a further one of said branches comprising a capacitor connected in series with a modulation signal responsive resistive impedance, a crystal tuned to series-resonance at a frequency within said range such that the phase shift provided by said crystal is opposite and substantially equal to the phase shift of said circuit and is variable in a second sense opposite to said first sense with changes in the frequency of said oscillations in said predetermined direction, means connecting one terminal of said crystal to said control electrode, means connecting the other terminal of said crystal to one end of said coil, means connecting the other end of said coil to said anode, means connecting said cathode to a point in said tuned circuit at a potential intermediate the potentials at said ends of said coil, and modulating means connected to said resistive impedance for modulating the value of said impedance and thereby modulating the frequency of said oscillations over said predetermined frequency range.

3. Means for generating oscillations modulated in frequency within a predetermined frequency range comprising an electron discharge device having at least a cathode, an anode and a control electrode, a parallel-tuned circuit having a plurality of parallel-connected branches and tuned to a frequency in said range such that the phase shift provided by said circuit has a predetermined value and is variable in a first sense with changes in the frequency of said oscillations in a predetermined direction, one of said branches comprising a coil, another of said branches comprising a capacitor and a further one of said branches comprising a capacitor connected in series with a modulation signal responsive crystal diode, a crystal tuned to series-resonance at a frequency within said range such that the phase shift provided by said crystal is opposite and substantially equal to the phase shift of said circuit and is variable in a second sense opposite to said first sense with changes in the frequency of said oscillations in said predetermined direction, means connecting one terminal of said crystal to said control electrode, means connecting the other terminal of said crystal to one end of said coil, means connecting the other end of said coil to said anode, means connecting said cathode to an intermediate point on said coil, and modulating means connected to said diode for varying the current through said diode and thereby modulating the frequency of said oscillations over said predetermined frequency range.

4. Means for generating oscillations modulated in frequency within a predetermined frequency range comprising a first electron discharge device having at least a cathode, an anode and a control electrode, a parallel-tuned circuit having a plurality of parallel-connected branches and tuned to a frequency in said range such that the phase shift provided by said circuit has a predetermined value and is variable in a first sense with changes in the frequency of said oscillations in a predetermined direction, one of said branches comprising a coil, another of said branches comprising a capacitor and a further one of said branches comprising a capacitor connected in series with a second electron discharge device having a control electrode, a crystal tuned to series-resonance at a frequency within said range such that the phase shift provided by said crystal is opposite and substantially equal to the phase shift of said circuit and is variable in a second sense opposite to said first sense with changes in the frequency of said oscillations in said predetermined direction, means connecting one terminal of said crystal to said control electrode of said first device, means connecting the other terminal of said crystal to one end of said coil, means connecting the other end of said coil to said anode, means connecting said cathode to an intermediate point on said coil, and a modulating signal source connected to said control electrode of said second electron discharge device for varying the resistance of said second device and thereby modulating the frequency of said oscillations over said predetermined frequency range.

References Cited in the file of this patent

UNITED STATES PATENTS

| | | |
|---|---|---|
| 2,298,437 | Usselman | Oct. 13, 1942 |
| 2,298,438 | Usselman | Oct. 13, 1942 |
| 2,298,774 | Parker | Oct. 13, 1942 |
| 2,426,295 | Born | Aug. 26, 1947 |
| 2,523,222 | Marks | Sept. 19, 1950 |
| 2,583,138 | Carter | Jan. 22, 1952 |
| 2,774,943 | Watson | Dec. 18, 1956 |